United States Patent
Shuto

(10) Patent No.: US 7,050,338 B2
(45) Date of Patent: May 23, 2006

(54) SEMICONDUCTOR INTEGRATED CIRCUIT DEVICE HAVING MEMORY CELLS DIVIDED INTO GROUPS

(75) Inventor: Susumu Shuto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/918,356

(22) Filed: Aug. 16, 2004

(65) Prior Publication Data
US 2005/0099874 A1   May 12, 2005

(30) Foreign Application Priority Data
Nov. 6, 2003   (JP)   ............... 2003-377155

(51) Int. Cl.
*G11C 5/14* (2006.01)
(52) U.S. Cl. ............... 365/189.09; 365/145; 365/149; 365/210
(58) Field of Classification Search ............ None
See application file for complete search history.

(56) References Cited

U.S. PATENT DOCUMENTS

| | | | | |
|---|---|---|---|---|
| 5,532,953 A | * | 7/1996 | Ruesch et al. | 365/145 |
| 6,285,576 B1 | * | 9/2001 | Kang | 365/145 |
| 6,493,251 B1 | * | 12/2002 | Hoya et al. | 365/145 |
| 6,867,997 B1 | * | 3/2005 | Komatsuzaki | 365/145 |
| 6,888,735 B1 | * | 5/2005 | Nishihara | 365/145 |

FOREIGN PATENT DOCUMENTS

| | | |
|---|---|---|
| JP | 9-139090 | 5/1997 |
| JP | 2000-90674 | 3/2000 |
| JP | 2003-7095 | 1/2003 |

* cited by examiner

*Primary Examiner*—Son Mai
(74) *Attorney, Agent, or Firm*—Oblon, Spivak, McClelland, Maier & Neustadt, P.C.

(57) ABSTRACT

A semiconductor integrated circuit device includes a plurality of memory cells divided into a plurality of groups, and a reference voltage selecting circuit which sets different reference voltages for the respective groups.

9 Claims, 7 Drawing Sheets

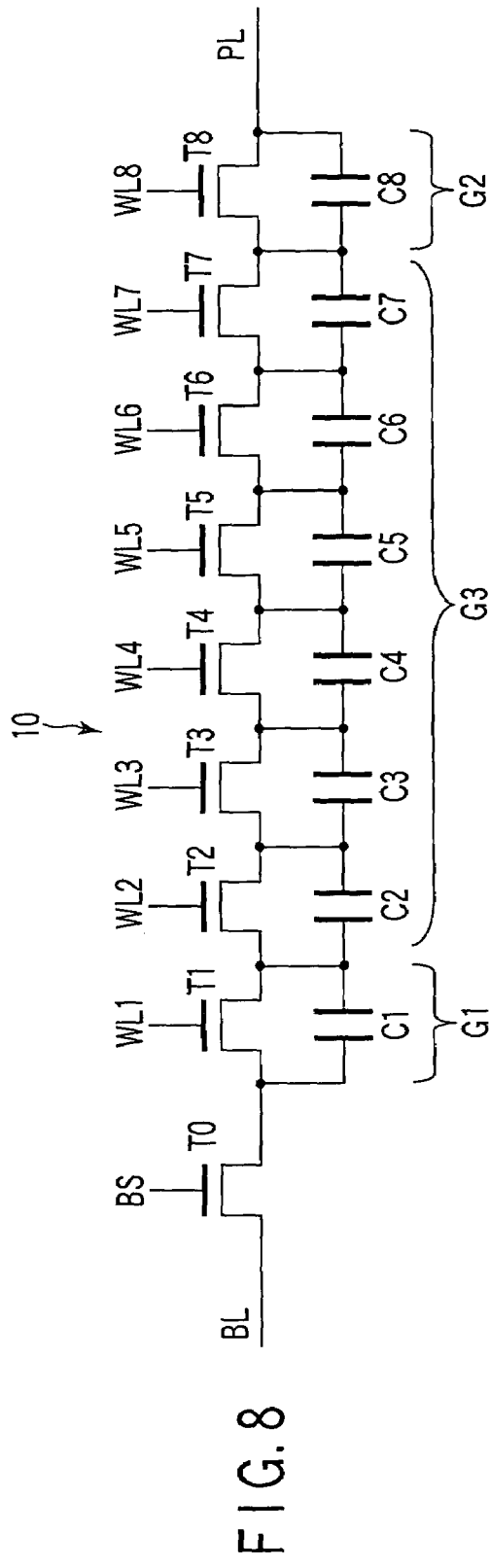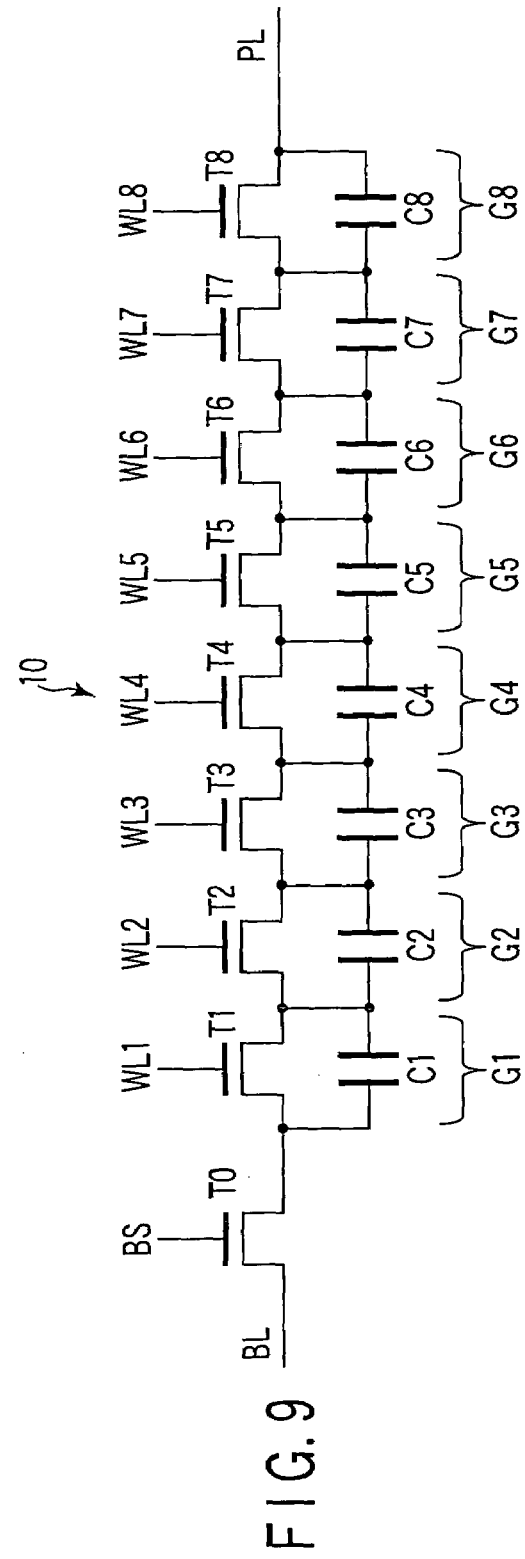
FIG. 8
FIG. 9

SEMICONDUCTOR INTEGRATED CIRCUIT DEVICE HAVING MEMORY CELLS DIVIDED INTO GROUPS

CROSS-REFERENCE TO RELATED APPLICATIONS

This application is based upon and claims the benefit of priority from prior Japanese Patent Application No. 2003-377155, filed Nov. 6, 2003, the entire contents of which are incorporated herein by reference.

BACKGROUND OF THE INVENTION

1. Field of the Invention

The present invention relates to a semiconductor integrated circuit device for adjusting a reference voltage for a read from a ferro-electric memory.

2. Description of the Related Art

In recent years, ferro-electric memories (FeRAM) using ferro-electric capacitors have been gathering much attention as nonvolatile semiconductor memories.

FIG. 11 is a circuit diagram schematically showing a cell section of a ferro-electric memory according to the prior art. As shown in this figure, memory that consists of series connected memory cells each having a transistor having a source terminal and a drain terminal and a ferro-electric capacitor inbetween said two terminals, hereafter named "Series connected TC unit type ferro-electric RAM"

Description will be given below of problems with the prior art by referring to a series connected TC unit type ferro-electric RAM by way of example.

A layout pattern of the series connected TC unit type ferro-electric RAM has two types of cells, as shown in FIG. 2: (a) cells having an upper electrode connected to a bit line BL (hereinafter referred to as cells A) and (b) cells having a lower electrode connected to the bit line BL (hereinafter referred to as cells B).

Owing to a difference in interfacial state between the upper electrode and the lower electrode, the polarization characteristic of a ferro-electric capacitor may vary depending on the direction of applied electric fields. This phenomenon is observed as, for example, the lateral asymmetry of a hysteresis loop.

For example, the cell A exhibits a laterally asymmetrical hysteresis curve such as the one shown in FIG. 12. The cell B exhibits a laterally asymmetrical hysteresis curve such as the one shown in FIG. 12. In FIGS. 12 and 13, lines L1 and L2 indicate the characteristics of a bit line capacity Cb. The inclinations of the lines L1 and L2 decrease consistently with the value of the bit line capacity Cb.

If the hysteresis loop is laterally asymmetric, the cells A and B may differ from each other in the absolute value of the amount of signals through the bit line BL.

As shown in FIGS. 14 and 15, the distribution of the signal amount in each cell type, that is, either the cell A or B, exhibits a sufficient signal amount margin between "1" data and "0" data. However, as shown in FIG. 16, the total signal distribution of a combination of the cells A and B exhibits an almost zero signal amount margin between the "1" data and the "0" data.

Prior art document information relating to the invention of the preset application is Jpn. Pat. Appln. KOKAI Publication No. 2003-7095.

As described above, for example, the series connected TC unit type ferro-electric RAM has two types of signal distributions corresponding to the cells A and B. If the signal amount distributions are classified into a plurality of groups and even if each group has a sufficient signal amount margin, these groups as a whole have a smaller signal amount margin. In the worst case, they have a zero margin. Such a reduced margin may result in bad bits. This hinders reliability and yield from being improved.

BRIEF SUMMARY OF THE INVENTION

According to an aspect of the present invention, a semiconductor integrated circuit device comprises a plurality of memory cells divided into a plurality of groups and a reference voltage selecting circuit which sets different reference voltages for the respective groups.

BRIEF DESCRIPTION OF THE SEVERAL VIEWS OF THE DRAWING

FIG. 8 is a diagram showing a first grouping according to a third embodiment of the present invention;

FIG. 9 is a diagram showing a second grouping according to the third embodiment of the present invention;

DETAILED DESCRIPTION OF THE INVENTION

Figure 1:
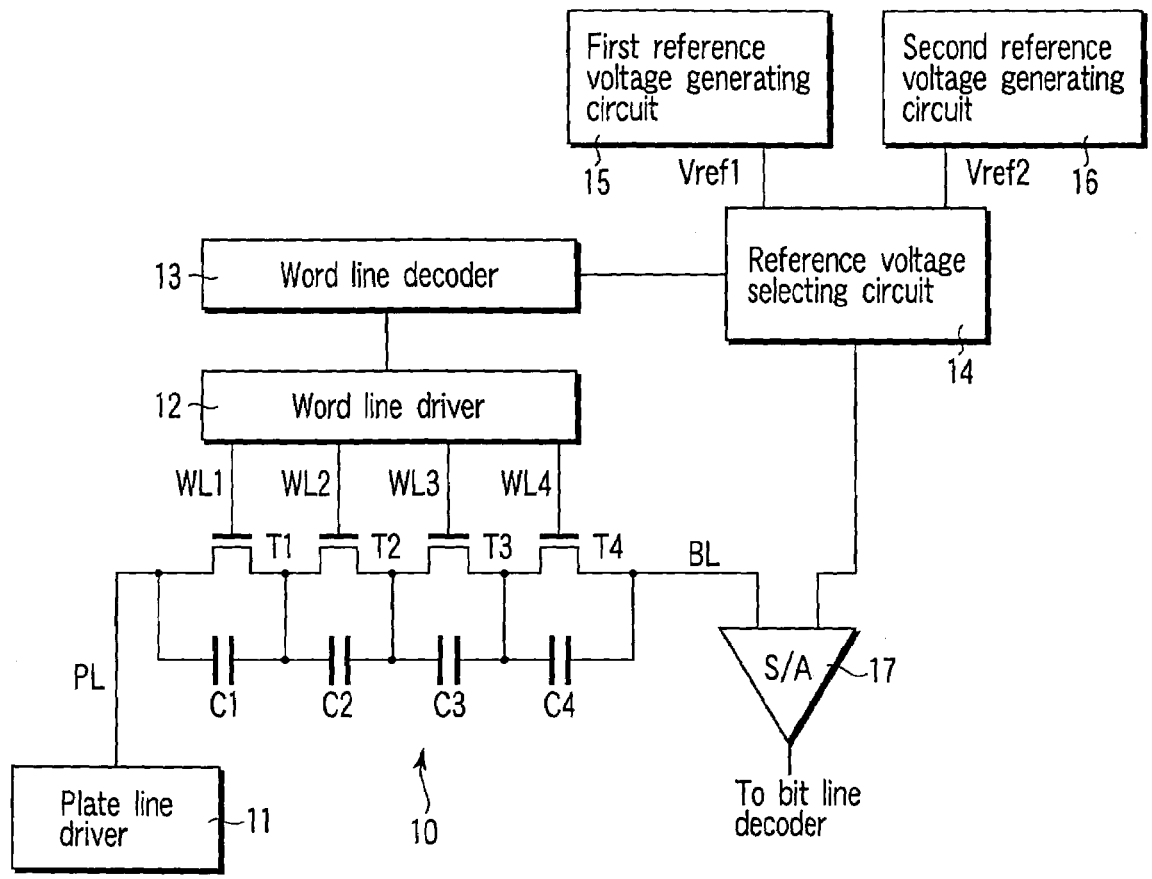
FIG. 1 is a schematic circuit diagram showing a semiconductor integrated circuit device according to a first embodiment of the present invention.

Embodiments of the present invention will be described below with reference to the drawings. In this description, common parts are denoted by common reference numerals throughout the drawings.

[First Embodiment]

In a first embodiment, if signal voltage distributions are classified into a plurality of groups, a signal margin is improved by providing each of the plural groups with a reference voltage for an actuating sense amplifier.

Figure 2:
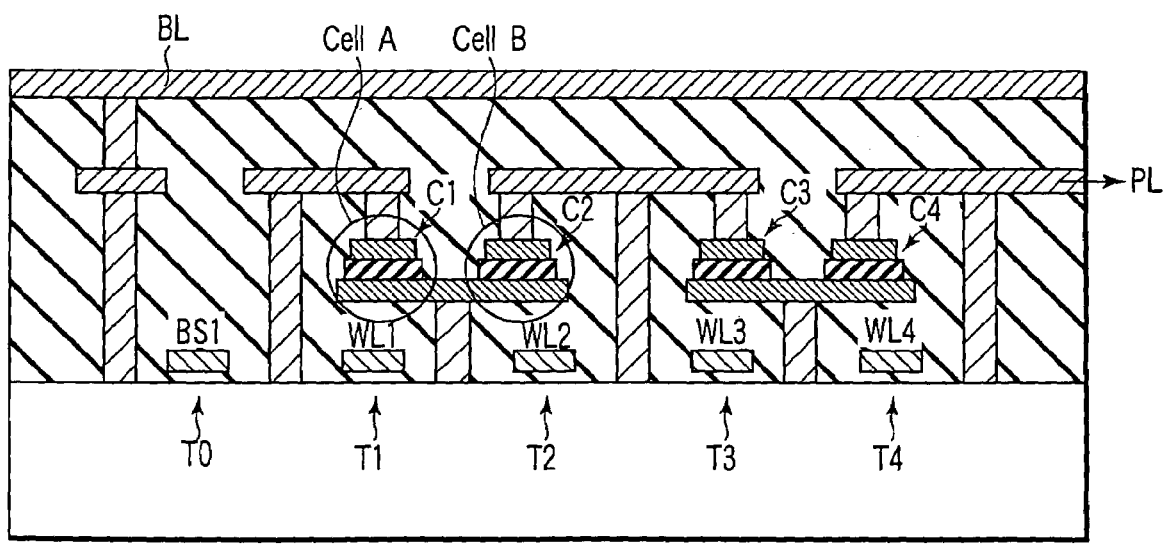
FIG. 2 is a sectional view showing a cell section of the semiconductor integrated circuit device according to the first embodiment of the present invention.
Figure 3:
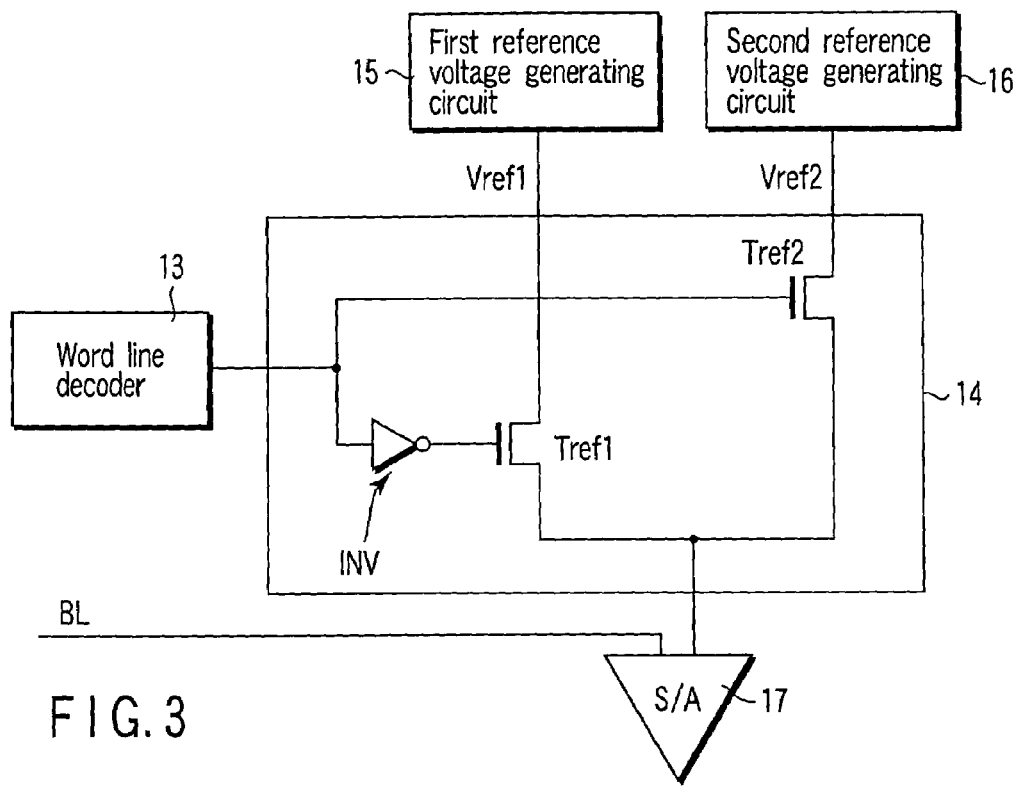
FIG. 3 is a circuit diagram showing the configuration of a reference voltage selecting circuit according to the first embodiment of the present invention.
Figure 4:
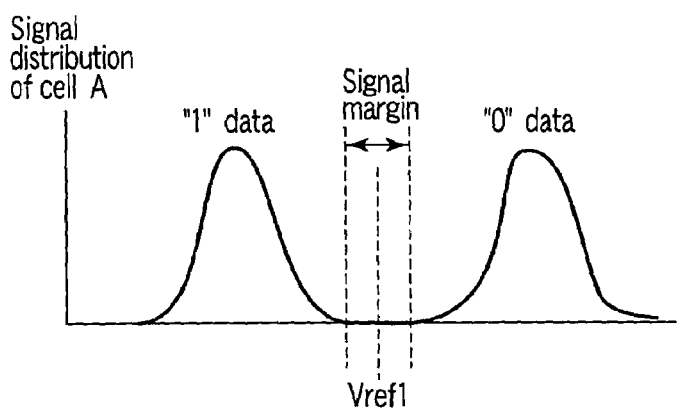
FIG. 4 is a graph showing the signal distribution of a cell A in the semiconductor integrated circuit device according to the first embodiment of the present invention.

FIG. 1 is a schematic circuit diagram of a semiconductor integrated circuit device according to a first embodiment of the present invention. FIG. 2 is a sectional view of memory cells according to the first embodiment of the present invention. FIG. 3 shows the configuration of a reference voltage selecting circuit according to the first embodiment of the present invention. By way of example, description will be given of one block of a "Series connected TC unit type ferro-electric RAM", described above.

As shown in FIG. 1, a semiconductor integrated circuit device has memory cell 10 of the series connected TC unit type ferro-electric RAM, a plate line driver 11, a word line driver 12, a word line decoder 13, a reference voltage selecting circuit 14, a first and second reference voltage generating circuits 15 and 16, and a sense amplifier (S/A) 17.

In the memory cell 10 of the series connected TC unit type ferro-electric RAM, the opposite ends of a ferro-electric capacitor C1 are connected to a source and a drain, respectively, of a transistor T1. The opposite ends of a ferro-electric capacitor C2 are connected to a source and a drain, respectively, of a transistor T2. The opposite ends of a ferro-electric capacitor C3 are connected to a source and a drain, respectively, of a transistor T3. The opposite ends of a ferro-electric capacitor C4 are connected to a source and a drain, respectively, of a transistor T4. These four cells are connected in series to constitute one cell block. One end of the cell block is connected to a bit line BL. The other end of the cell block is connected to a plate line PL. The plate line PL is connected to the plate line driver 11.

The gates of the transistors T1, T2, T3, and T4 are connected to word lines WL1, WL2, WL3, and WL4, respectively. The word line driver 12 is connected to the word lines WL1, WL2, WL3, and WL4. The word line decoder 13 is connected to the word line driver 12.

The reference voltage selecting circuit 14 is connected to the word line decoder 13. The first and second reference voltage generating circuits 15 and 16 are connected to the reference voltage selecting circuit 14 to generate a first and second reference voltages Vref1 and Vref2, respectively.

An output from the bit line BL and an output from the reference voltage selecting circuit 14 are inputted to the sense amplifier 17. An output from the sense amplifier 17 is connected to a bit line decoder.

Since the memory cell 10 has a series connected TC unit type ferro-electric RAM structure, there are two types of cells in terms of the connection between an electrode of a ferro-electric capacitor and the bit line BL, as described for the prior art. Specifically, as shown in FIG. 2, there are (a) cells A having an upper electrode connected to the bit line BL and (b) cells B having a lower electrode connected to the bit line BL.

Thus, the circuit configuration in FIG. 1 includes the reference voltage generating circuits 15 and 16 in order to generate the reference voltages Vref1 and Vref2 for two types of signal distributions corresponding to the cells A and B.

As shown in FIG. 3, the reference voltage selecting circuit 14 has two transistors Tref1 and Tref2 and an inverter INV that outputs inverted data of an input. One end of a source/drain of the transistor Tref1 is connected to the first reference voltage generating circuit 15. The other end of the source/drain of the transistor Tref1 is connected to the sense amplifier 17. A gate of the transistor Tref1 is connected to the word line decoder 13 via the inverter INV. One end of a source/drain of the transistor Tref2 is connected to the second reference voltage generating circuit 16. The other end of the source/drain of the transistor Tref2 is connected to the sense amplifier 17. A gate of the transistor Tref2 is connected to the word line decoder 13.

In the reference voltage selecting circuit 14, the two types of cells, i.e. the cells A and B, having different absolute values of the signal amount, can be classified depending on whether the least significant bit from the word line decoder 13 is "1" or "0". Consequently, either the reference voltage Vref1 or Vref2 is selected depending on the least significant bit from the word line decoder 13.

Figure 5:
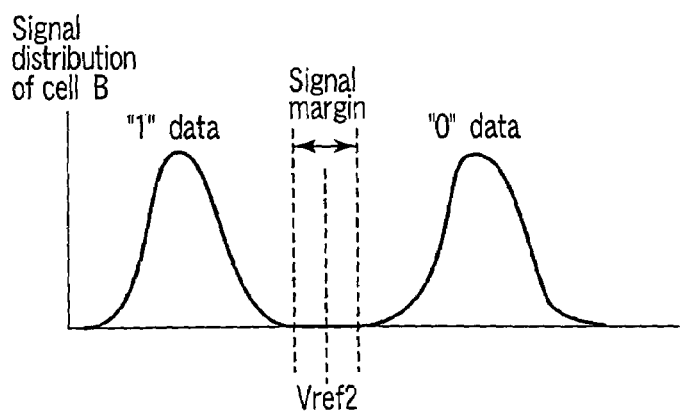
FIG. 5 is a graph showing the signal distribution of a cell B in the semiconductor integrated circuit device according to the first embodiment of the present invention.

For example, the first reference voltage Vref1 is set for the cell A. The second reference voltage Vref2 is set for the cell B. These settings enable the reference voltage to be set for each cell to ensure a sufficient signal margin even if the cells A and B exhibit different signal distributions as shown in FIG. 5.

According to the first embodiment, described above, if the signal amount distributions are classified into a plurality of groups, as many potential generating circuits as the groups are provided, the circuits generating different reference voltages Vref. Then, the reference voltage selecting circuit 14 can be used to select the reference voltage Vref for each group. Accordingly, even if there are a plurality of signal amount distributions, a large signal margin can be ensured compared to the prior art. The signal margin can thus be improved to avoid the bad bit problem. This serves to improve reliability and yield.

In the first embodiment, the series connected TC unit type ferro-electric RAM has been described by way of example. For the TC parallel unit series connected cells, owing to their layout, the signal amounts are in principle classified into two groups. Accordingly, the above arrangement is very effective on the series connected TC unit type ferro-electric RAM structure. However, the present invention is not limited to this structure. That is, the first embodiment is applicable even if the cell signal amounts are in principle classified into more than two groups. In this case, as many reference voltages as the groups may be provided, and the configuration of the reference voltage selecting circuits may be changed so as to allow one of the plurality of reference voltages to be correspondingly selected.

[Second Embodiment]

In the first embodiment, for the plurality of reference voltages, as many reference voltage generating circuits as the reference voltages are provided. In contrast, in a second embodiment, one reference voltage generating circuit generates a plurality of reference voltages.

Normally, the reference voltage generating circuit has a function of generating a plurality of potentials for testing. Specifically, one reference circuit can simultaneously generate a plurality of potentials. The second embodiment utilizes this characteristic to change the configuration of the reference voltage generating circuit according to the first embodiment.

Figure 6:
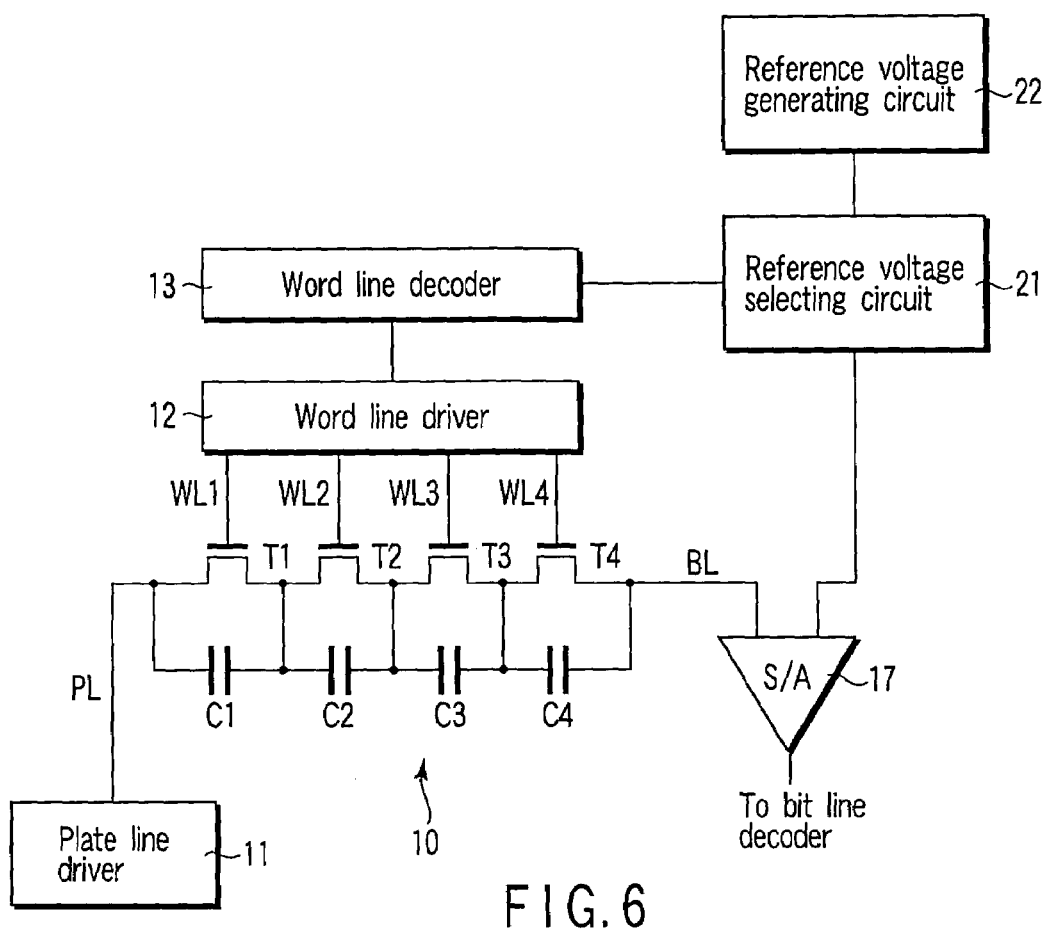
FIG. 6 is a schematic circuit diagram showing a semiconductor integrated circuit device according to a second embodiment of the present invention.
Figure 7:
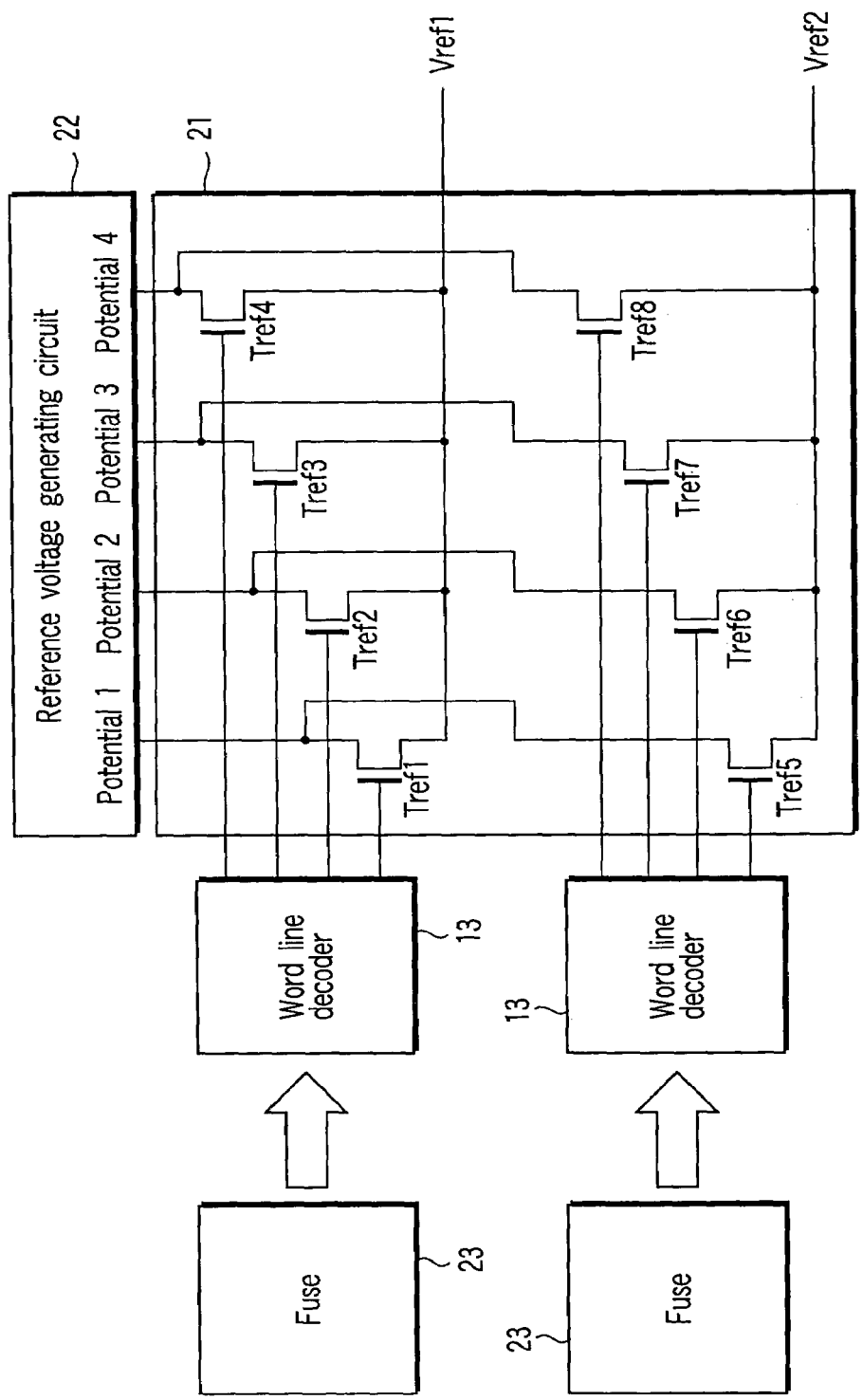
FIG. 7 is a circuit diagram showing the configuration of a reference voltage selecting circuit according to a second embodiment of the present invention.
Figure 11:
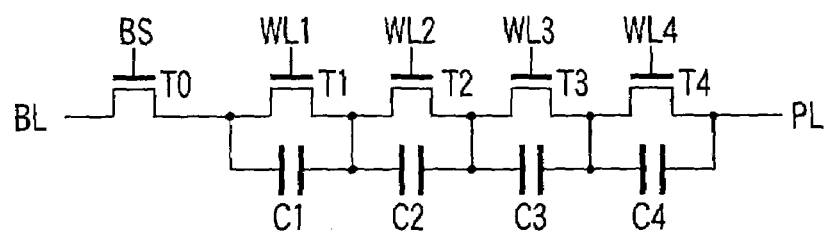
FIG. 11 is a circuit diagram showing a series connected TC unit type ferro-electric RAM according to the prior art.
Figure 12:
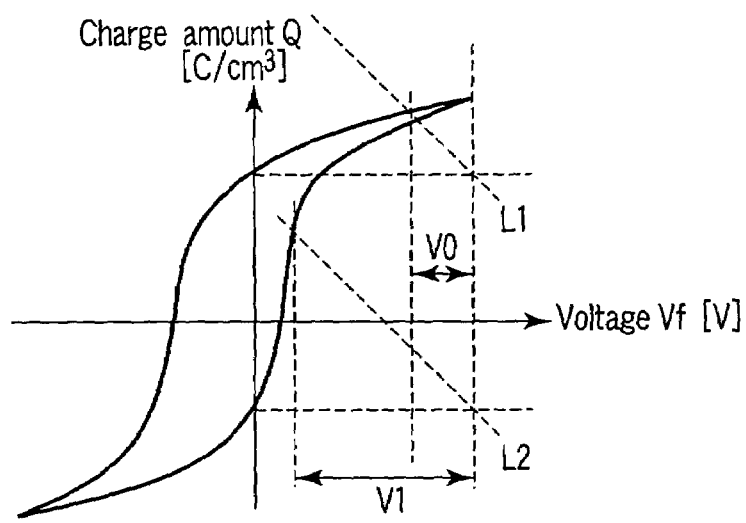
FIG. 12 is a graph showing a hysteresis curve of a cell A in a ferro-electric memory according to the prior art.
Figure 13:
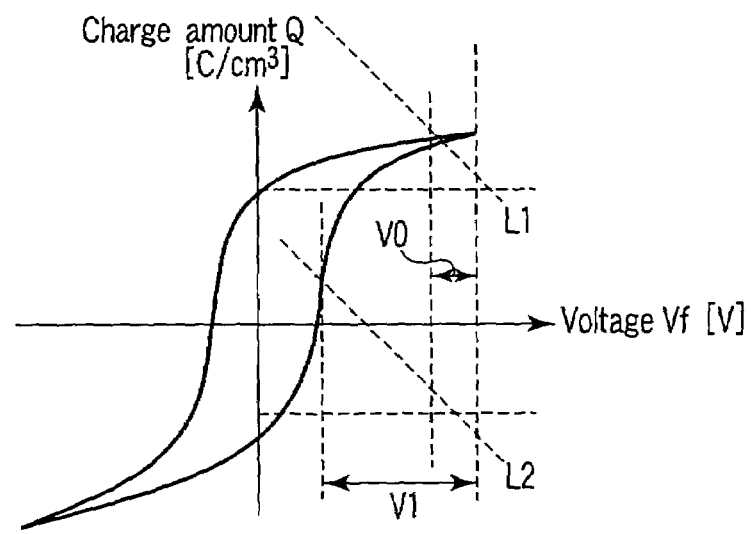
FIG. 13 is a graph showing a hysteresis curve of a cell B in the ferro-electric memory according to the prior art.
Figure 14:
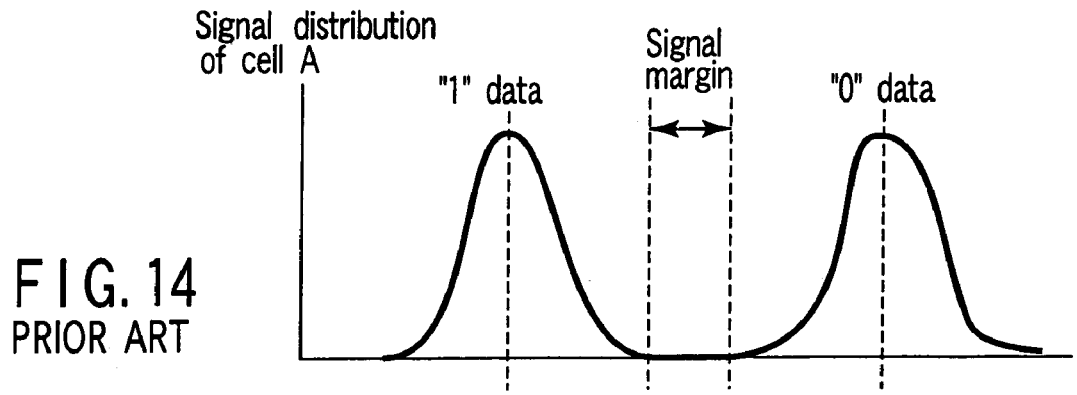
FIG. 14 is a graph showing the signal distribution of the cell A in the ferro-electric memory according to the prior art.
Figure 15:
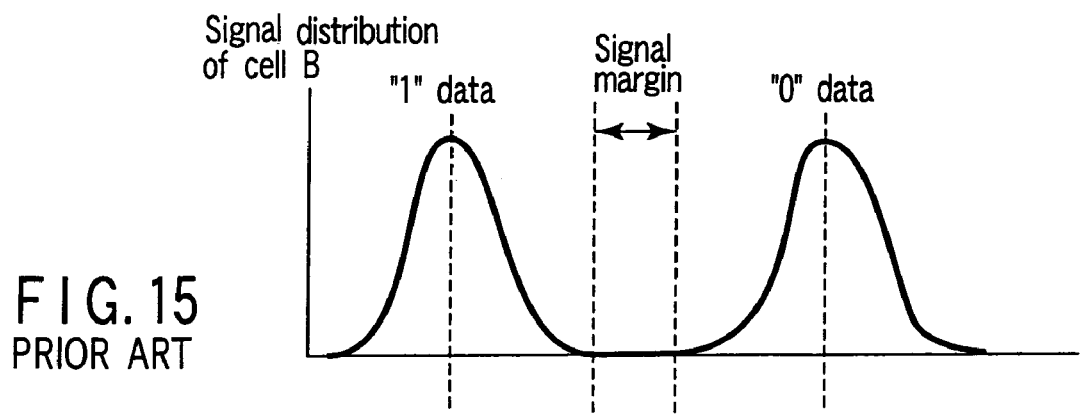
FIG. 15 is a graph showing the signal distribution of the cell B in the ferro-electric memory according to the prior art.
Figure 16:
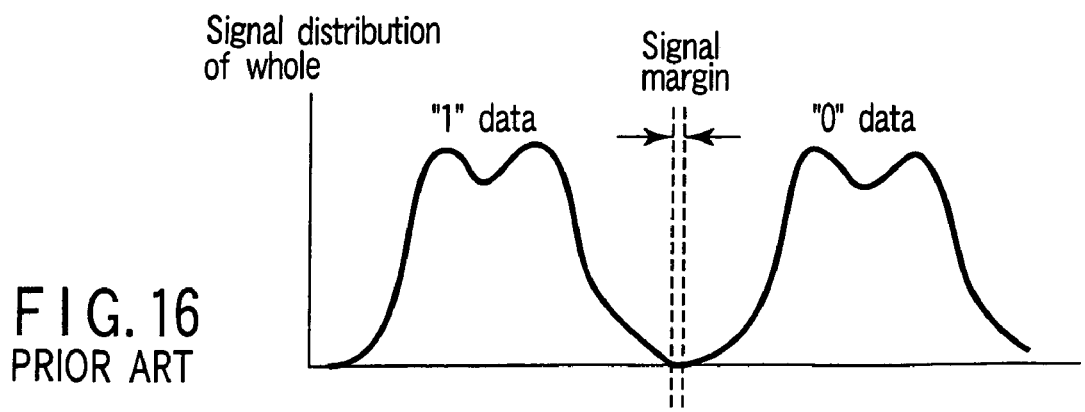
FIG. 16 is a graph showing the signal distribution of a combination of the cells A and B in the ferro-electric memory according to the prior art.

FIG. 6 is a schematic circuit diagram showing a semiconductor integrated circuit device according to the second embodiment of the present invention. FIG. 7 is a circuit diagram showing the configuration of a reference voltage selecting circuit according to the second embodiment of the present invention. Description will be given of a "Series connected TC unit type ferro-electric RAM" by way of example as in the case of the first embodiment.

As shown in FIG. 6, the semiconductor integrated circuit device has memory cell 10 of the series connected TC unit type ferro-electric RAM, the plate line driver 11, the word line driver 12, the word line decoder 13, a reference voltage selecting circuit 21, a reference voltage generating circuit 22, and the sense amplifier 17.

In this case, as shown in FIG. 7, the reference voltage generating circuit 22 has a function of generating four potentials labeled 1 to 4. The numbers of these potentials are set in the order of the magnitude of the potential so that for example, the potential 1 is set to be the lowest and the potential 4 is set to be the highest.

Furthermore, as shown in FIG. 7, the reference voltage generating circuit 21 is provided with transistors Tref1, Tref2, Tref3, Tref4, Tref5, Tref6, Tref7, and Tref8 in association with the potentials 1 to 4.

In the second embodiment, any of the potentials 1 to 4 is selected by the corresponding one of the transistors Tref1, Tref2, Tref3, Tref4, Tref5, Tref6, Tref7, and Tref8, connected to the respective outputs of the reference voltage generating circuit 22. Finally, two potentials Vref1 and Vref2 are obtained. For example, information on the blowout of fuses 23 determines which of the transistors Tref1, Tref2, Tref3, Tref4, Tref5, Tref6, Tref7, and Tref8 is opened, i.e. which potential is selected.

The second embodiment produces effects similar to those of the first embodiment. Moreover, the second embodiment requires only one reference voltage generating circuit 22, thus advantageously enabling an increase in chip area to be suppressed compared to the first embodiment.

[Third Embodiment]

A third embodiment shows several examples of groupings used if the signal amount distributions are classified into a plurality of groups.

In a first example, attention is paid to the fact that in a block of memory cell of the series connected TC unit type ferro-electric RAM, different signal distributions are exhibited by a cell located at an end of the block which is closer to the bit line BL, a cell located at an end of the block which is closer to the plate line PL, and a cell located in the center of the block.

Specifically, as shown in FIG. 8, one block of the memory cell section 10 is divided into three groups. A group G1 is composed of the cell located closest to the bit line BL. A group G2 is composed of the cell located furthest from the bit line BL (closest to the plate line PL). A group G3 is composed of central six cells that do not belong to the group G1 and G2. In this case, since the block is divided into the three groups G1, G2, and G3, three reference voltages are provided.

In a second example, attention is paid to the fact that the signal distribution varies depending on how far each cell lies from the bit line BL in a block of memory cells that are the series connected TC unit type ferro-electric RAM.

Specifically, one block of the memory cell section 10 is divided into eight groups G1 to G8 as is illustrated in FIG. 9. The cell nearest the bit line BL is a first group G1, the second nearest cell is a second group G2, the third nearest cell is a third group G3, and so forth. The cell remotest from the bit line BL is the eighth group G8. In this case, eight reference voltages are provided for the eight groups G1 to G8, respectively.

In a third example, attention is paid to the fact that the signal distribution varies depending on a position in the planar pattern of the memory cell section 10.

Figure 10:
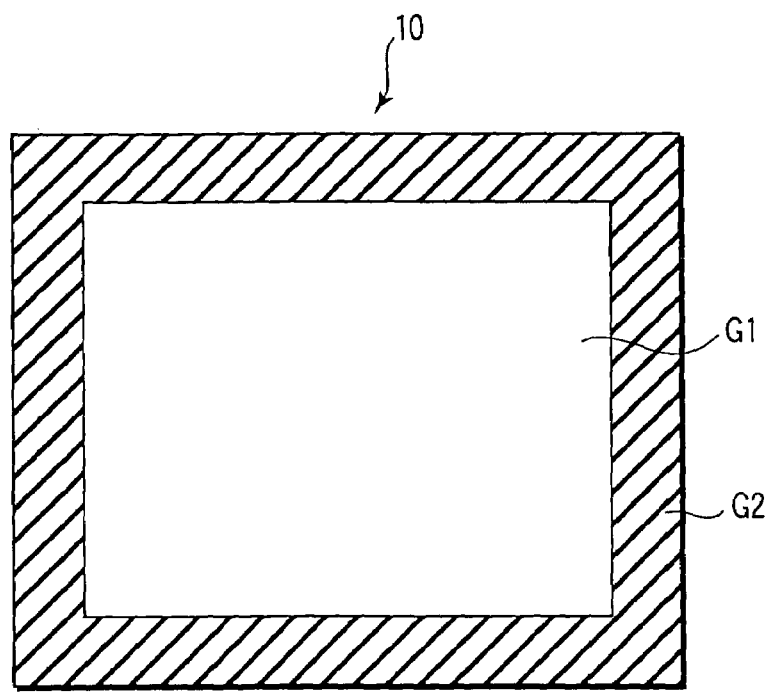
FIG. 10 is a diagram showing a third grouping according to the third embodiment of the present invention.

Specifically, as shown in FIG. 10, the planar pattern of the memory cell section 10 is divided into two groups. A central portion constitutes a first group G1. A peripheral portion constitutes a second group G2. In this case, since the block is divided into the two groups G1 and G2, two reference voltages are provided.

In a fourth example, attention is paid to the fact that the signal distribution varies with cell arrays within a chip. Accordingly, one reference voltage is set for each cell array. The cell arrays are formed to be exactly the same in terms of the layout. However, the cell arrays are located at different physical positions within the chip and are thus located at different distances from, for example, a peripheral circuit. These differences result in small differences between the signal amount distributions exhibited by the cell arrays. It is thus effective to set a reference voltage for each of the groups into which the cell arrays are divided.

According to the above third embodiment, one reference voltage is provided for each group as in the case of the first embodiment. This serves to accommodate the differences between the signal amount distributions of the respective groups. It is thus possible to set reference voltages with large margins compared to the prior art.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a plurality of memory cells divided into a plurality of groups, absolute values of signal amounts output from the memory cells of the different groups being different among the groups; and
   a reference voltage selecting circuit which sets different reference voltages for the respective groups.

2. A semiconductor integrated circuit device comprising:
   a plurality of memory cells divided into a plurality of groups, each of the memory cells having a ferro-electric capacitor and a cell transistor;
   a reference voltage selecting circuit which sets different reference voltages for the respective groups;
   a plurality of word lines connected to the respective cell transistors;
   a word line driver connected to the word lines;
   a word line decoder connected to the word line driver and the reference voltage selecting circuit; and
   a sense amplifier to which the reference voltages outputted by the reference voltage selecting circuit.

3. The semiconductor integrated circuit device according to claim 1, further comprising a plurality of reference voltage generating circuits the number of which is the same as that of the reference voltages and which generate the respective reference voltages.

4. The semiconductor integrated circuit device according to claim 1, further comprising one reference voltage generating circuit which generates the different reference voltages for the respective groups.

5. A semiconductor integrated circuit device comprising:
   a plurality of memory cells divided into a plurality of groups; and
   a reference voltage selecting circuit which sets different reference voltages for the respective groups;

wherein each of the memory cells has a ferro-electric capacitor and a cell transistor, a unit cell is constructed by connecting opposite ends of the ferro-electric capacitor to a source and a drain, respectively, of the cell transistor, and a block is composed of a plurality of the unit cells connected in series, and a bit line is connected to one end of the block, and a plate line is connected to the other end of the block.

6. The semiconductor integrated circuit device according to claim 5, wherein the plurality of groups comprise:

a first group in which an upper electrode of the ferro-electric capacitor is connected to the bit line; and a second group in which a lower electrode of the ferro-electric capacitor is connected to the bit line.

7. The semiconductor integrated circuit device according to claim 5, wherein the plurality of groups comprises:

a first group composed of a cell located at an end of the block which is closer to the bit line;

a second group composed of a cell located at an end of the block which is closer to the plate line; and a third group composed of cells located in a center of the block.

8. The semiconductor integrated circuit device according to claim 5, wherein the plurality of groups are each composed of one cell so that a first group is composed of a cell located at a cell located at an end of the block which is closer to the bit line, while a final group is composed of a cell located at an end of the block which is closer to the plate line.

9. The semiconductor integrated circuit device according to claim 1, wherein the plurality of groups comprise:

a first group composed of cells located in a central portion of a memory cell array composed of the plurality of memory cells; and a second group composed of cells located in a peripheral portion of the memory cell array.

* * * * *